(12) United States Patent
Ashe et al.

(10) Patent No.: US 6,399,402 B2
(45) Date of Patent: Jun. 4, 2002

(54) PASSIVATION OF INK JET PRINT HEADS

(75) Inventors: James Ashe, Edinburgh; Christopher David Phillips, Beds; Stuart Speakman, Chelmsford; Andrew Lee, Cottenham, all of (GB)

(73) Assignee: Xaar Technology Limited, Cambridge (GB)

( * ) Notice: Subject to any disclaimer, the term of this patent is extended or adjusted under 35 U.S.C. 154(b) by 0 days.

(21) Appl. No.: 09/804,846

(22) Filed: Mar. 13, 2001

Related U.S. Application Data

(63) Continuation of application No. 09/294,732, filed on Apr. 19, 1999, now Pat. No. 6,232,135, which is a continuation of application No. PCT/GB97/02878, filed on Oct. 17, 1997.

(30) Foreign Application Priority Data

Oct. 24, 1996 (GB) .............................. 9622177

(51) Int. Cl.⁷ ............................................. H01L 21/66
(52) U.S. Cl. ........................................................ 438/21
(58) Field of Search ............................ 438/21, 38, 800; 29/25.35

(56) References Cited

U.S. PATENT DOCUMENTS

| | | | |
|---|---|---|---|
| 4,671,850 A | 6/1987 | Shimkunas | 156/643 |
| 4,892,142 A * | 1/1990 | Labaton | 165/134.1 |
| 5,326,725 A | 7/1994 | Sherstinsky et al. | 437/225 |
| 5,393,577 A | 2/1995 | Uesugi et al. | 427/586 |
| 5,433,809 A | 7/1995 | Pies et al. | 156/268 |
| 5,462,603 A | 10/1995 | Murakami | 118/719 |
| 5,485,663 A | 1/1996 | Ochiai et al. | 29/25.35 |

FOREIGN PATENT DOCUMENTS

| | | |
|---|---|---|
| EP | 277 703 A1 | 8/1988 |
| EP | 364 136 A2 | 4/1990 |
| EP | 0 445 596 A2 | 9/1991 |
| EP | 0 464 515 A2 | 1/1992 |
| JP | 57069780 | 4/1982 |
| JP | 07101056 | 4/1995 |
| WO | WO 95/07820 | 3/1995 |
| WO | WO 97/39897 | 10/1997 |

OTHER PUBLICATIONS

International Search Report dated Jan. 19, 1998, in PCT/GB97/02878.
Written Opinion dated Aug. 3, 1998, in PCT/GB97/02878.
International Preliminary Examination Report dated Jan. 18, 1999, in PCT/GB97/02878.
European Search Report in European Application No. 01115744.3 dated Aug. 2, 2001.

* cited by examiner

*Primary Examiner*—Charles Bowers
*Assistant Examiner*—Craig Thompson
(74) *Attorney, Agent, or Firm*—Marshall, Gerstein & Borun

(57) ABSTRACT

A process for the selective passivation of the channel walls of a channelled ink-jet printhead component by the chemical vapor deposition of a passivant coating, the process comprising mounting the component in a support in registration with a datum location therein, the support having masking means for masking selected areas of the component, and depositing the passivant coating on unmasked portions of the channel walls.

3 Claims, 7 Drawing Sheets

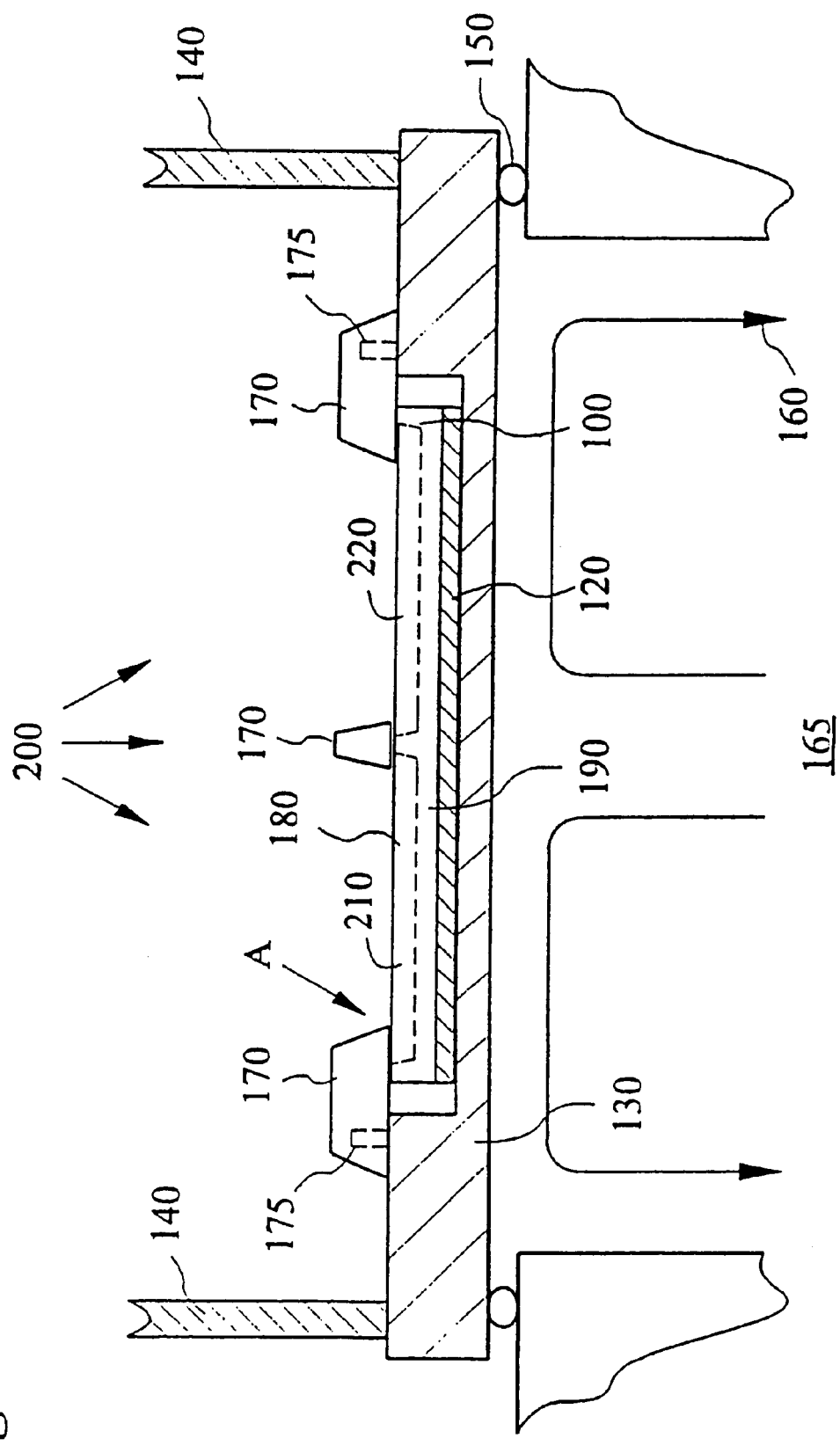

PASSIVATION OF INK JET PRINT HEADS

CROSS-REFERENCE TO RELATED APPLICATIONS

This is a continuation of U.S. application Ser. No. 09/294,732 filed Apr. 19, 1999 now U.S. Pat. No. 6,232,135, which is a continuation of international application no. PCT/GB97/02878 filed Oct. 17, 1997.

The present invention relates to selective passivation of the channel walls of a channelled inkjet printhead component by the chemical vapour deposition of a passivant coating and, in another aspect, to a method of vacuum processing the surface of a component in general.

BACKGROUND OF THE INVENTION

1. Field of the Invention

2. Description of Related Technology

The protection of a surface by deposition of a passivant layer (e.g. Silicon Nitride) by chemical vapour deposition in a vacuum is known in the art, for example from J. Applied Physics 66, No. 6, pages 2475–2480. The technique is predominantly used in the manufacture of semiconducting devices where restriction of coating to those areas where it is needed is achieved by use of photolithographic masking. As illustrated in FIG. 1(a), a layer of masking material 1 remains at selected locations on the substrate 2 following the dissolving of areas (indicated by 3) that have not been exposed to UV radiation in a preceding step. The entire substrate is then exposed to passivant coating as indicated at 4. FIG. 1(b) shows the substrate 2 following the coating process: passivant 5 has been deposited on the areas 3 whilst any passivant deposited on the masking material has been taken away with the removal of the masking material itself. The aforementioned masking process is known in the art and works well with the manufacture of devices on planar silicon wafers.

Passivation of channelled ink jet printheads is discussed in general terms in EP-A-0 364 136, incorporated herein by reference. FIG. 2(a) is a section through a printhead of the kind disclosed in this document taken perpendicular to the longitudinal axis of the channels: such devices comprise an array of channels 12 formed in a sheet 14 of piezoelectric material, suitably lead zirconium titanate (PZT), that has been poled in its thickness direction as indicated by arrows 15. Each channel is defined by side walls 16, a bottom surface 18 and a top sheet 20 and has formed on the surface of each side wall an electrode 34.

As is known, for example from EP-A-0 277 703 incorporated herein by reference, application of a electric field across electrodes 34 formed on opposite surfaces of a side wall 16 causes the piezoelectric material of the side wall to deflect in shear mode, thereby causing the ejection of an ink droplet from a nozzle associated with the channel.

As shown in FIG. 2(b), which is a sectional view taken along the longitudinal axis of a channel, such a nozzle 24 can be located at the forward end of each channel 12 which in turn comprises a forward part 36 of uniform depth which is plated to approximately one half the channel depth and a rearward part 38 of lesser depth which is fully plated over the base and walls to form connection tracks. The forward part of the electrodes in the channel apply the aforementioned actuating electric field whilst the rearward, connection track part of the electrodes are connected, e.g. by wire bonding, to actuating voltage supply means (not shown). Nickel, nichrome (an alloy of nickel and chromium) and aluminium have proved particularly suitable as electrode materials due to their high conductivity and suitability for wire bonding.

Subsequent passivation of the electrodes on the channel walls of such a printhead is necessary to protect the electrodes from attack by the ink contained in the channels during operation of the printhead. Aluminium in particular requires passivation to inhibit electrolysis and bubble formation or corrosion which could occur if the electrode were in direct contact with the ink. Protection is particularly desirable where the ink is aqueous or otherwise electrically conductive.

The composition of the passivation layer is chosen act as an electron and/or ion and/or ink barrier and is preferably configured so as to extend down one channel side wall, across the base of the channel, up the other channel side wall and over the top of that wall into the adjacent channel, thereby creating a continuous protective layer free of any edges under which ink might otherwise seep. A chemical vapour deposition process particularly suitable for the passivation of the "deep" channels shown in FIGS. 2(a) and (b)—i.e. channels having an aspect (height/width) ratio of at least 3:1—is disclosed in WO95/07820 incorporated herein by reference.

It will be appreciated that the connection track in the rearward part 38 of the printhead must be kept free of passivation in order that a connection (generally a wire bond) from the track to a driving circuit can be made. However, the aforementioned photolithographic masking techniques conventionally used when depositing a passivant layer by chemical vapour deposition have proved difficult to use in such a situation: in particular, application and removal of masking material on the walls and bottom surface of the rearward part of each channel (typically having a width of 60–90 $\mu$m and a depth of 20–25 $\mu$m) has proved complex and difficult. These problems are exacerbated where it is desired to mask not only the rearward part 38 but also a section of the full-depth, forward part 36 of the channel (typical width 60–90 $\mu$m, typical depth 300–400 $\mu$m), as proposed for the printhead constructions disclosed in co-pending International application no. PCT/GB97/01083 (WO97/39897, belonging to the present applicant and incorporated herein by reference.

SUMMARY OF THE INVENTION

The present invention has as one objective a process for the selective passivation of the walls of the channel of a deep channel inkjet printhead that does not share the disadvantages of the conventional techniques and yet guarantees accurate placement of the passivation coating in the inkjet printhead channel.

Accordingly, the present invention comprises in a first aspect in a process for the selective passivation of the channel walls of a channelled inkjet printhead component by the chemical vapour deposition of a passivant coating, the process comprising mounting said component in a support in registration with a datum location therein, the support having masking means for masking selected areas of the component, and depositing the passivant coating on unmasked portions of the channel walls.

By virtue of the mask, fixed to the support rather than being located on the component itself, it is possible to shield from passivation in a simple but effective manner certain sections of the channel walls of the channels formed in the component. Furthermore, accuracy of masking is guaranteed by a datum location on the support that allows the component to be passivated to be accurately positioned relative to the support and thus relative to the mask.

Advantageously, the masking means are integral with the support. The inventors have found that chemical vapour deposition in accordance with the present invention generally results in the heating of the surface of the mask, and such an integral construction facilitates heat flow away from the surface into the remainder of the support, thereby reducing any tendency the mask might have to warp out of alignment with the component being passivated.

Preferably, a first, channelled surface of the component is held resiliently in abutment with the support. It has been found that this feature is particularly useful where the component to be processed comprises a material—such as lead zirconium titanate (PZT—having a dimensional tolerance lower than that which can be achieved with conventional materials such as silicon and where there may be a significant variation in thickness across the component. In such a situation, conventional clamping on both surfaces of the component would give rise to a variation in the clamping forces and distortion of the component. Abutment of only one surface of the component against the support avoids such problems.

That surface of the component which opposes the first, channelled surface of the component advantageously undergoes heat transfer with a fluid. Such direct transfer, without the intervention of a base plate and associated heat sink compounds and pads, allows more precise control of the temperature of the component.

A membrane may be interposed between the component and the fluid. Whilst such a membrane presents little resistance to heat transfer, it does maintain the vacuum in the chamber in the event that the component is or becomes porous (e.g. by cracking). Furthermore, the membrane is advantageously attached to the support so as to retain the component within the support, if not in complete abutment with the support, resulting in an assembly that is more easily handled.

A second aspect of the invention comprises a method of vacuum processing a first surface of a component in a vacuum chamber housing a component support, wherein a membrane separates a second surface of the component which opposes said first surface from a heating/cooling fluid, heat transfer taking place between the component and the fluid across the membrane, the method comprising the steps of placing the component in a support such that the first surface of the component abuts the support, attaching the membrane to the support so as to retain the component in the support, and vacuum processing the first surface of the component so located in the support.

The arrangement of a support which abuts the side of the component to be processed and to which a membrane is attached to retain the component in the support allows the non-processed side of the component to be cooled (or even heated) by a fluid whilst ensuring that, in the event of the component being or becoming porous (e.g. by cracking), none of the fluid will escape into the vacuum chamber (which would disrupt the vacuum necessary for processing). Furthermore, by retaining the component in the support by the membrane, an assembly is created which is easier to handle than the component alone or the component sitting loose in the support.

The aforementioned arrangement is of particular advantage where the component forms part of a wafer. Such wafers can be difficult to handle, especially wafers of piezoelectrically-active material and lead zirconium titanate (PZT) in particular.

Further advantageous embodiments of the present invention are set out in the accompanying claims, description and figures.

BRIEF DESCRIPTION OF THE DRAWINGS

The invention will now be described by way of example by reference to the following diagrams, of which:

FIG. 2b is a sectional view taken along a longitudinal axis of a channel of the printhead of FIG. 2a.

FIG. 3(a) is a sectional view of apparatus according to a first embodiment of the present invention;

DETAILED DESCRIPTION OF THE INVENTION

Figure 1A:
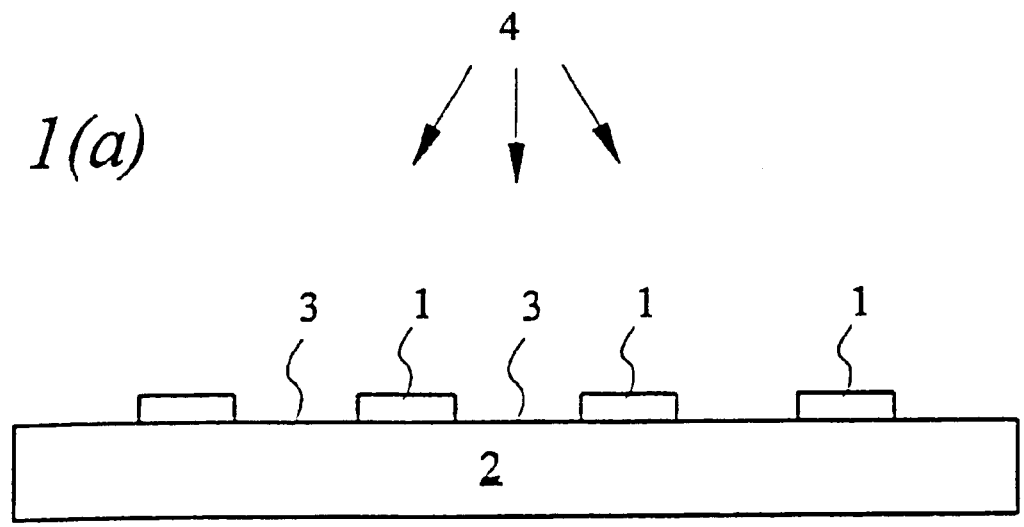
FIG. 1a is a sectional view of a substrate to be protected by deposition of a passivant layer according to a chemical vapor deposition coating process of the prior art.
Figure 1B:
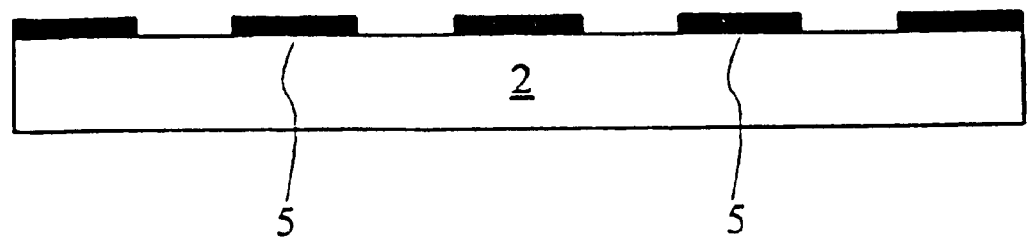
FIG. 1b is a sectional view of the substrate of FIG. 1a following the coating process.

Referring to FIG. 3(a), there is illustrated a wafer 100 of PZT poled in a thickness direction. The upper surface 180 of the wafer is formed with several sets 210,220 of parallel channels in accordance with WO95/18717 (incorporated herein by reference) in order that a still greater number of individual printheads may be formed by dicing the wafer across the channels in a step discussed subsequently. Electrodes (not shown) are formed on the walls of the channels as discussed above.

Wafer 100 is mounted on thermally-conductive pad 120 comprising silver-loaded silicone—as is known in the art—and is in turn mounted on a thermally-conducting (e.g. carbon or a metal such as aluminium) plate 130 by a thin layer of heat sink compound (not shown) sandwiched between the two. The dimensions of plate 130 are such that it can be clamped in conventional vacuum processing equipment (an annular clamping ring and sealing "O" ring are indicated at 140 and 150 respectively) and a cooling fluid (generally helium contained in chamber 165) passed over the back of the plate as indicated at 160.

A mask 170 abuts the upper surface 180 of the wafer and is attached to the plate 130 by means that ensure accurate registration between the mask and the plate and thus accurate placement of the passivant layer on the wafer. In the example shown, the means comprise first and second dowels 175 that protrude from the plate 130 and locate with a bore and slot (not shown) in the mask 170. The diameter of the bore is matched to that of the corresponding dowel to ensure accurate registration between mask and plate, whilst the slot in which the second dowel is located for thermal expansion of the mask during the passivation process.

Silicone pad 120 flexibly supports the lower surface 190 of the wafer, compensating for any variation in the thickness of the wafer and avoiding distortion of the wafer due to uneven clamping forces.

The mask can be made of any vacuum compatible, thermally conductive material including, for example, carbon, stainless steel and aluminium. The mask in the example of FIG. 4a comprises aluminium of approximately 2 mm thickness where it covers the wafer.

Figure 3B:
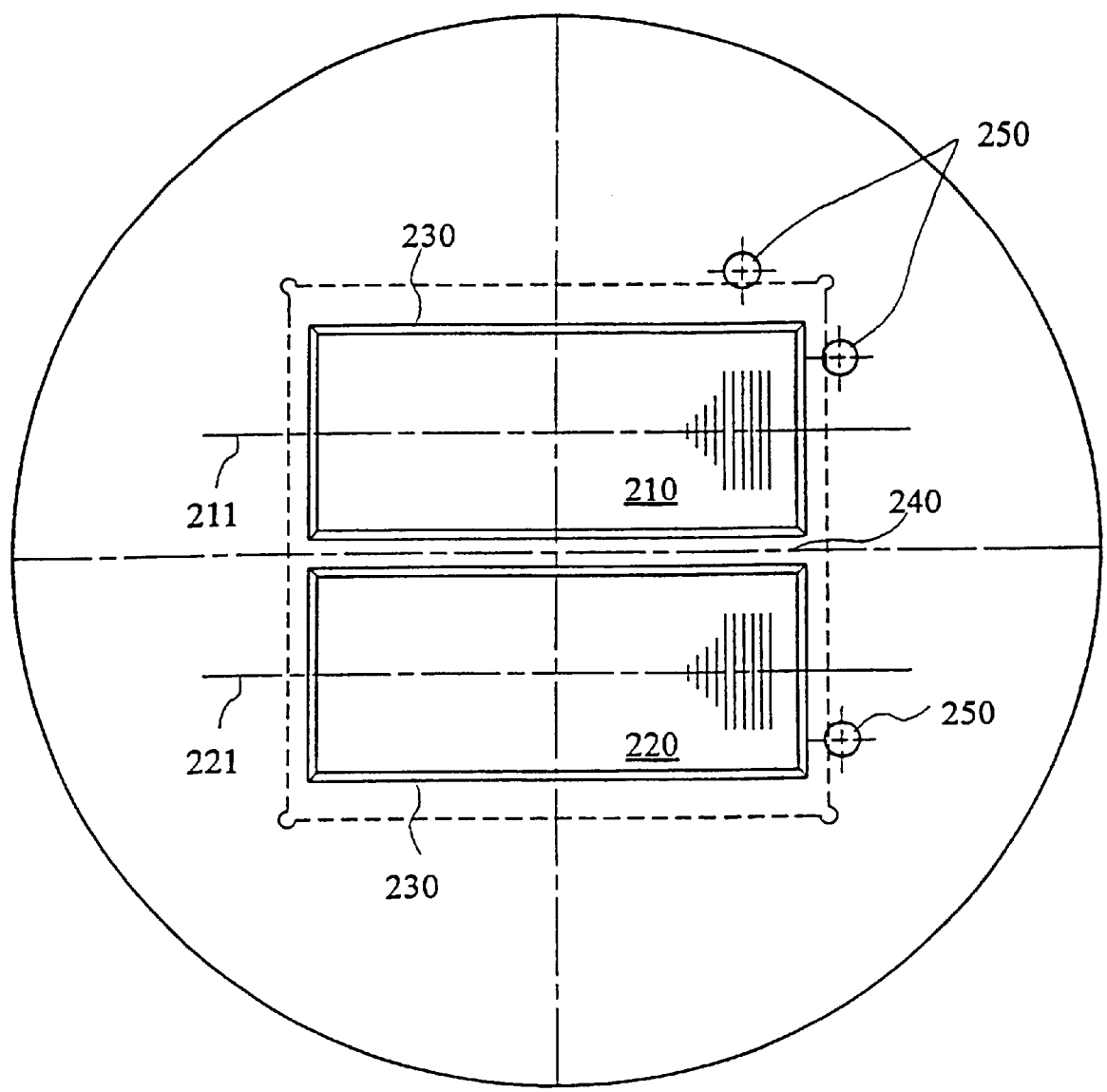
FIG. 3(b) is a plan view corresponding to FIG. 3(a)

Turning to FIG. 3(b), reference number 250 indicates datum features (metal dowels in the example shown) mounted on the plate 130 and with which the wafer is aligned. As explained in the aforementioned WO95/18717, these datum features and the corresponding locations (not shown) on the wafer are used in the preceding manufacturing step of sawing the channels in the wafer and allow the channels formed in the wafer to correctly positioned in subsequent manufacturing steps. It will appreciated that the two datum dowels 250 shown in FIG. 3(b) register with two corresponding locations on the wafer, thereby allowing the component to be accurately positioned relative to the support (and thus the mask) in two mutually-perpendicular directions.

In FIG. 3(b), for example, two sets of channels 210,220 have been formed in the wafer. In a subsequent manufacturing step, these sets of channels will be cut along lines 211 and 221 respectively to form four rows of printheads each of the kind shown in FIG. 3b. In order that each row of printheads might have its rearward part 42 free of passivation so as to allow electrical connection to the electrode plating, it is necessary to accurately mask the wafer not only at its edges 230 but also in the middle 240.

It will be appreciated that accurate positioning of the mask relative to the channels is facilitated by the registration means 175 between the mask 170 and plate 130 on the one hand, and by the registration means 250 between the plate 130 and the wafer 130 formed with the channels on the other hand.

Figure 3C:
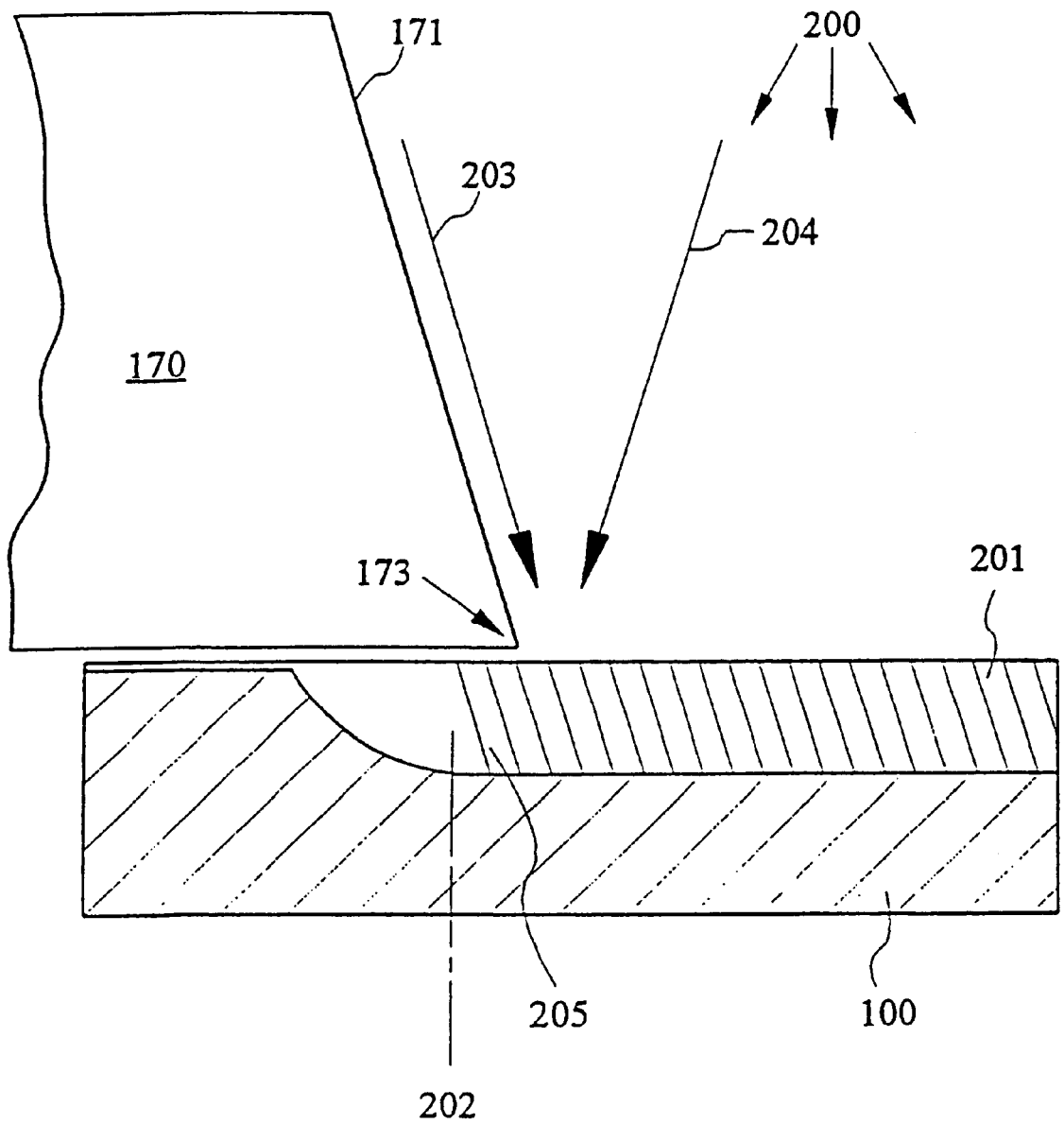
FIG. 3(c) is a detail view at A in FIG. 3(a)

FIG. 3(c) shows the detail of the mask and channel as indicated at A in FIG. 3(a): as has already been mentioned, passivation of the walls of the channels of deep channel ink jet printheads is preferably carried out using a process as described in WO95/07820, a characteristic of which is that the path of the passivant molecules from their source to the surface of the wafer is not linear but involves multiple scattering.

As a consequence of this, the edge of the mask is advantageously angled (typically at 60°) as indicated at 171 so as not to obstruct the path of a molecule approaching at a non-normal angle to the substrate as shown at 203. It is also advantageous for the apex 173 of the mask aperture chamfer 171 to be located close to or touching the surface of the wafer so as to minimise the amount of passivant (which may be on the opposite path 204) making its way underneath the mask as indicated at 205. This latter problem can be additionally compensated for, if necessary, by making the apex 173 extend—typically by an amount equal to the depth of the channel—beyond that point 202 in the channel where the passivant layer is designed to end.

Figure 2A:
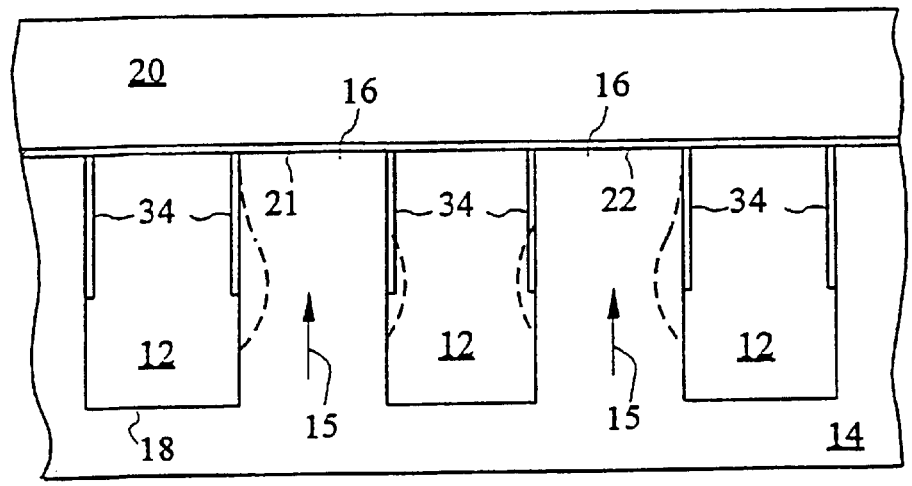
FIG. 2a is a sectional view of a printhead of the prior art.
Figure 2B:
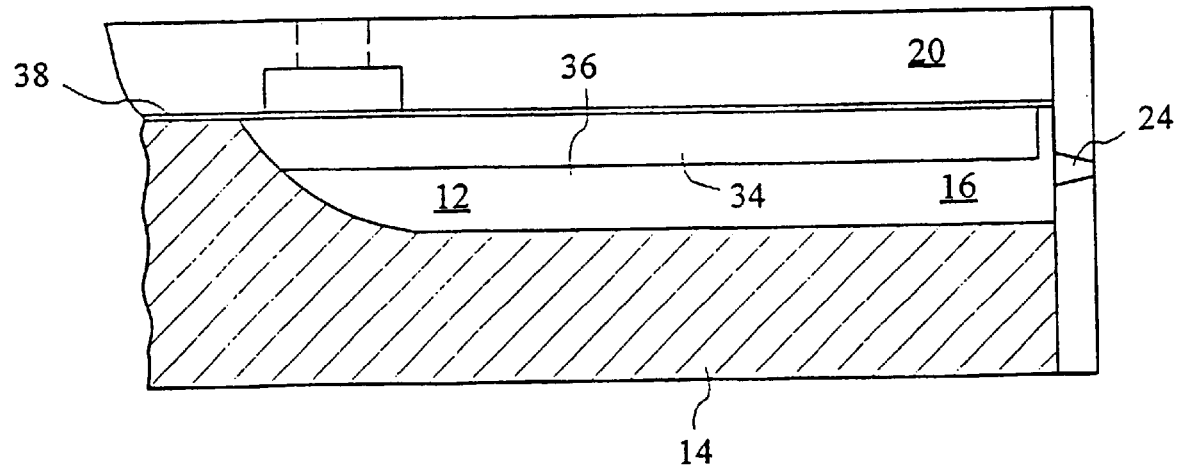
Figure 4A:
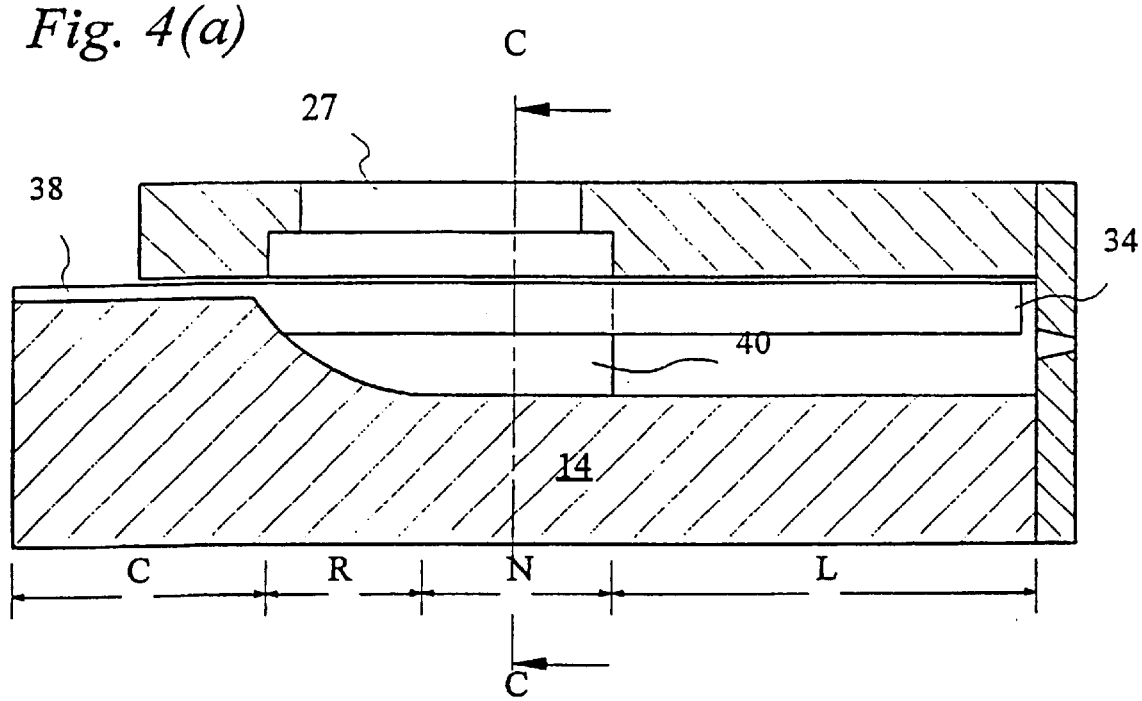
FIG. 4(a) is a sectional view along a channel of a printhead manufactured in accordance with the present invention.

In addition or as an alternative to the above, sections of the channel walls may be selectively passivated prior to application of electrodes in accordance with the aforementioned pending PCT application no. PCT/GB97/01083. As illustrated in FIG. 4(a), such a printhead has a portion (N) of full-depth channel which is open on one side to an ink supply window 27 (and which therefore is not part of the "active" length L of the channel) that differs from the conventional construction of FIG. 2(b) in that a layer 40 of passivant material having a lower dielectric constant than that of the piezoelectric material of the channel side walls is interposed between the electrode 34 and the piezoelectric material of the channel walls 16.

Figure 4B:
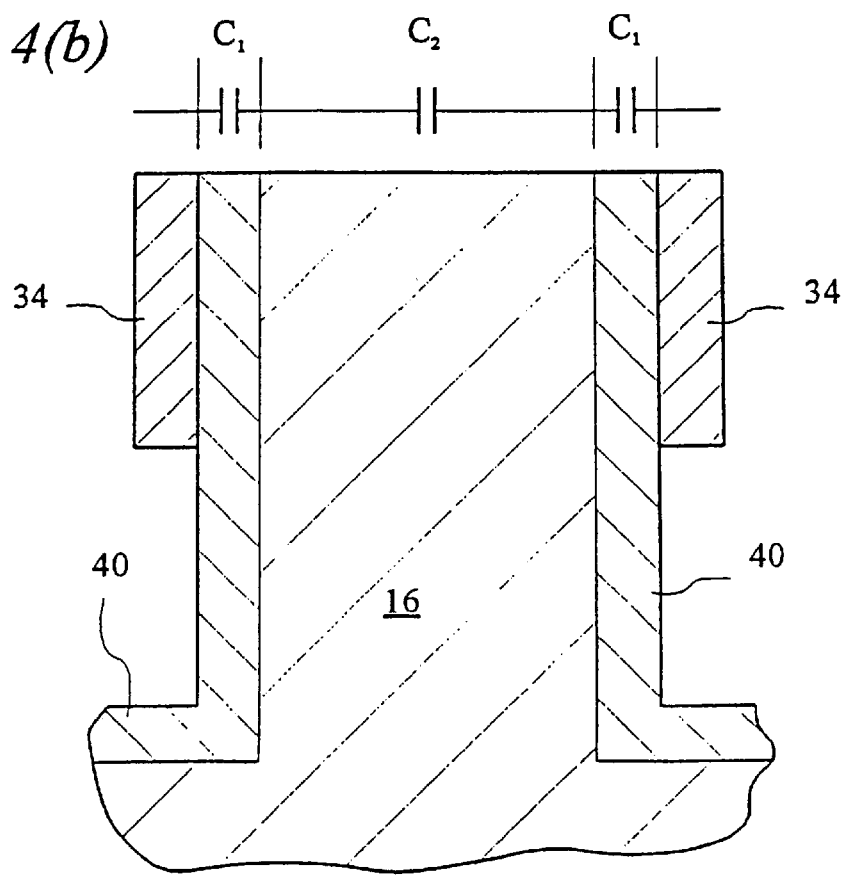
FIG. 4(b) is a sectional view of a channel wall of the printhead taken along line C—C of FIG. 4(a)

As will be evident from FIG. 4(b), which is a sectional view of the channel wall portion, the resulting total capacitance of the piezoelectric material (capacitance C1) sandwiched in series between two passivant layers (capacitance C2) will be less than that of the piezoelectric material of the wall alone since, to a first approximation, the total capacitance is given by $1/C_{total}=1/C2+2/C1$. As a result, the overall capacitive load of the printhead is reduced.

As can be seen from FIG. 4(a), this technique can also be applied in the region C of the connection tracks, as well as in the runout region R. It will appreciated that to be effective, the pre-passivation layer 40 must be accurately located in the channel relative to the electrodes and ink inlet. This can be achieved by use of an appropriate mask in accordance with the present invention.

Figure 5:
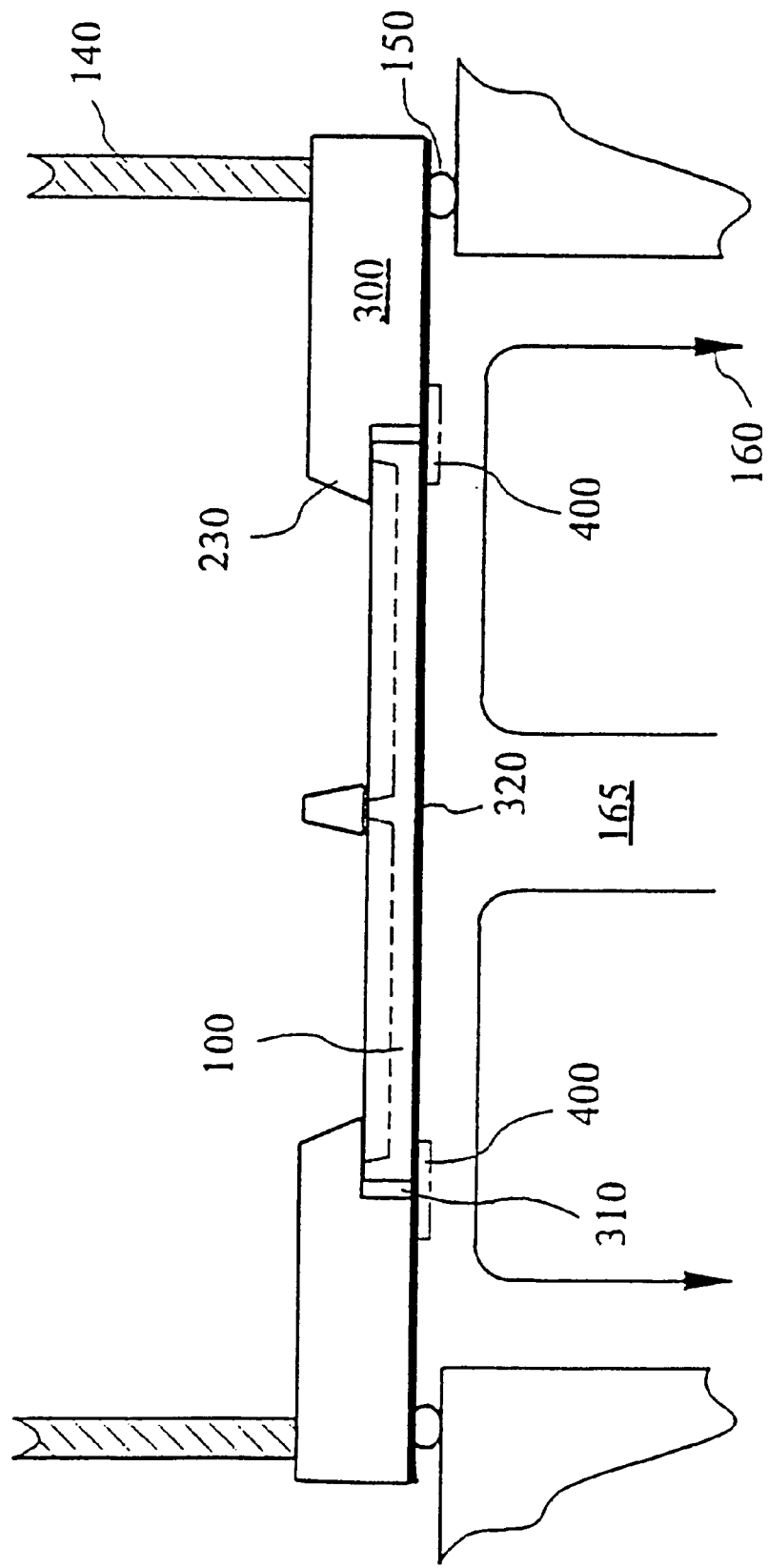
FIG. 5 is a sectional view of a second embodiment of the invention.

FIG. 5 illustrates a further embodiment of the invention, with those features that have already been discussed with reference to FIGS. 3(a)–(c) bearing the same reference numbers. Wafer 100 formed with sets of channels 210,220 in an upper surface 180 thereof sits in a pocket 310 within an integrated mask/support structure 300 with its upper surface 180 abutting the structure 300 at some at least of the masking edges 230. A gas-inpermeable membrane 320 extends over the wafer 100 and the rear of structure 300—thereby to retain the wafer in the pocket 310—and thereafter extends to the edge of the structure to seal with the "O" ring 150 of the conventional vacuum processing equipment (comprising annular clamping ring 140)—thereby isolating the entire support from the cooling gas.

Thereafter, it is possible to circulate cooling (or heating) gas 160 in the chamber 165 beneath the clamped support in the conventional manner, with significantly greater heat transfer between the wafer 100 and the cooling gas 160 being possible through the membrane 320 than is possible through the heat sink compound, silicone pad and aluminium plate of the arrangement of FIGS. 4a,b.

The present invention is particularly suitable for coating the walls of channels formed in piezoelectric material with an inorganic passivation layer in accordance with the aforementioned WO95/07820. This process involves maintaining the bulk temperature of the channelled wafer at below 200° C. and at which not more than 30% depolarisation of the material will occur, and exposing the surface of the channel walls to be passivated to a homogenised vapour of the coating material, the vapour having undergone multiple scattering during transport from its source to the surface of the channelled component.

The arrangement of the present invention allows the surface of the wafer on which deposition is taking place to be held at a much lower temperature (typically 40° C. rather than 140° C.) which in turn permits the use of the more active kinds of piezoelectric material—particularly kinds of PZT—which would be depoled at the higher temperatures. Alternatively, the arrangement can allow existing temperature levels to be maintained with higher temperature passivation techniques e.g. the use of higher microwave power or RF biasing of the wafer.

Furthermore, such an arrangement helps reduce temperature variation across the wafer between those parts shaded from deposition by the mask and those parts fully exposed to deposition: without such cooling, temperature differences of the order of 60° C. can build up between adjacent parts of the wafer in a matter of a 30 seconds with the resulting differential expansion leading to cracking of the wafer.

The membrane 320 also ensures that, in the event of the wafer cracking or the wafer material being gas permeable, cooling gas does not escape into the processing chamber. Advantageously, the membrane is releasably adhered to the rear of the integrated structure 300, thereby retaining the wafer in the integrated structure even when the latter is removed from the vacuum processing apparatus. This facilitates handling, especially of fragile wafers, and is an arrangement applicable to all vacuum processing, not merely passivation or chemical vapour deposition. Membranes made of polymer—for example pvc, polyester, polyimide—and having a thickness of 50–100 $\mu$m have in particular proved to have sufficient strength and advantageous heat transfer characteristics.

As an alternative to the membrane 320, a self-adhesive tape made of a vacuum-compatible, gas-impermeable material such as polyimide can be used to seal the gap between the perimeter of the wafer 100 and the edge of the pocket 310 (as indicated by dashed lines 400 in FIG. 5). Such an arrangement presents slightly less resistance to heat transfer than the membrane and is less likely to entrap pockets of air that might otherwise act to insulate the lower surface of the wafer from the cooling gas flow, giving rise to hotspots. Tape may also be placed on the lower surface of the wafer in those areas particularaly susceptible to cracking.

As with the first embodiment, abutment of the wafer 100 on one side only avoids distortion of the wafer due to uneven clamping forces attributable to uneven wafer thickness. The central portion 240 of the mask 170 of FIG. 5 also provides a degree of support at the centre of the wafer 100 against the pressure exerted on the lower surface 190 by the cooling fluid 160.

The integrated construction of mask and support according to FIG. 5 facilitates yet further heat transfer from the surface of the mask to the base of the support and thence to the cooling gas. As with the previous embodiment, datum points can be provided in the structure—in the example shown these are dowels mounted at the edges of the pocket 310—against which the wafer can locate, thereby ensuring accurate alignment between the wafer and the overlying mask.

It should be understood that the invention has been described by way of examples only and a wide variety of modifications can be made without departing from the scope of the invention.

The height of the channel electrodes, for example, may be optimised for minimum power consumption (approximately proportional to the product of the capacitance and the square of the operating voltage) rather than minimum operating voltage. This will result in electrodes that extend only one third of the way down the channel walls rather than half way down as per the aforementioned EP-A-0 364 136.

The top sheet which closes the open-topped channels will typically be made of similar piezoelectric material to that of the sheet in which the channels are formed so as to ensure thermal matching. Although EP-A-0 364 136 would suggest that the sheet be unpoled so as to avoid distortion by stray electric fields, use of poled material has not been found to have any significant effect on printhead performance in practice and has the advantage of reducing inventory to a single type of (poled) piezoelectric material.

After assembly of the top sheet, the individual channels may be tested by measuring the capacitance between the two electrodes located on either side of the wall. Alternatively, the resonant behaviour of the walls can be measured in accordance with EP-A-0 376 606. Both techniques can be carried out automatically by a device having probes that touch onto the connection tracks of the two electrodes bounding a wall, perform a measurement and then index along to the next channel.

The nozzle plate in which the channel nozzles are formed may be attached to the printhead in accordance with WO95/11131, advantageously using a hot melt adhesive so as to allow the nozzle plate to be removed should the subsequent nozzle formation process prove unsuccessful. Suitable adhesives will depend on the type of ink to be used and may include Paragon HM240/12, HM260/12 and HM 31/12; Borden HM617; 3M 3748Q and 3764Q; Prodag 873, 697, 984 and Bostik HM 5649.

The nozzle plate may also be shaped, e.g. by ablation, prior to attachment so as to vary in thickness from 40–50 $\mu$m at the centre of the channel array to 1–20 $\mu$m at the extremities of the channel array. This allows a thicker glue layer to form at the extremities of the channel array, making the nozzle plate more resistant to shear and peel stresses, particularly in the channel array direction.

Nozzle formation is advantageously carried out following attachment of the nozzle plate using the techniques described in WO93/15911. In accordance with WO96/08375, a protective tape may be applied to the non-wetting coating of the nozzle plate using pressure sensitive adhesives such as Datac P7085, Swift K9250 and DPAC 4427.

Each feature disclosed in this specification (which term includes the claims) and/or shown in the drawings may be incorporated in the invention independently of other disclosed and/or illustrated features.

What is claimed is:

1. A method of vacuum processing a first surface of a component in a vacuum chamber housing a component support, wherein a membrane separates a second surface of the component which opposes said first surface from a heat transfer fluid, heat transfer taking place between the component and the fluid across the membrane, the method comprising the steps of placing the component in the support such that the first surface of the component abuts the support, attaching the membrane to the support so as to retain the component in the support, and vacuum processing the first surface of the component.

2. Method according to claim 1 wherein the component takes the form of a wafer.

3. Method according to claim 2 wherein a plurality of components are contained in a wafer, respective surfaces of which are vacuum processed simultaneously.

* * * * *